United States Patent
Kawamura et al.

(10) Patent No.: US 6,536,344 B2
(45) Date of Patent: Mar. 25, 2003

(54) PRINTING PLATE AUTOMATIC EXPOSING DEVICE

(75) Inventors: Yoshinori Kawamura, Kanagawa (JP); Yoshihiro Koyanagi, Kanagawa (JP); Mitsuyoshi Nishimura, Saitama (JP); Takashi Kato, Saitama (JP)

(73) Assignees: Fuji Photo Film Co., Ltd., Kanagawa (JP); Fuji Photo Optical Co., Ltd., Saitama (JP)

( * ) Notice: Subject to any disclaimer, the term of this patent is extended or adjusted under 35 U.S.C. 154(b) by 29 days.

(21) Appl. No.: 09/810,248

(22) Filed: Mar. 19, 2001

(65) Prior Publication Data

US 2001/0022145 A1 Sep. 20, 2001

(30) Foreign Application Priority Data

Mar. 17, 2000 (JP) .................................. 2000-077022

(51) Int. Cl.[7] .................................................. B41F 27/00
(52) U.S. Cl. ............ 101/477; 101/389.1; 101/DIG. 36; 355/87
(58) Field of Search ..................... 101/389.1, DIG. 36, 101/477, 485, 483; 355/87; 248/362

(56) References Cited

U.S. PATENT DOCUMENTS

| | | | | |
|---|---|---|---|---|
| 3,774,192 A | * | 11/1973 | Boulter | 307/116 |
| 4,334,472 A | * | 6/1982 | Back et al. | 101/389.1 |
| 4,699,370 A | * | 10/1987 | Hashimoto et al. | 271/227 |
| 4,984,017 A | * | 1/1991 | Nishida et al. | 355/91 |
| 5,374,021 A | * | 12/1994 | Kleinman | 248/362 |
| 5,738,014 A | * | 4/1998 | Rombult et al. | 101/477 |
| 5,788,425 A | * | 8/1998 | Skow et al. | 406/88 |
| 5,825,500 A | * | 10/1998 | Iino et al. | 356/394 |
| 5,887,525 A | * | 3/1999 | Okamura et al. | 101/401.1 |
| 5,988,060 A | * | 11/1999 | Asai et al. | 101/123 |
| 6,076,464 A | * | 6/2000 | Okamura | 101/401.1 |
| 6,089,150 A | * | 7/2000 | Uchiyama | 101/116 |
| 6,112,663 A | * | 9/2000 | Ulrich et al. | 101/389.1 |
| 6,186,491 B1 | * | 2/2001 | Tomiyama et al. | 271/10.03 |
| 6,338,480 B1 | * | 1/2002 | Endo | 271/104 |

* cited by examiner

Primary Examiner—Andrew H. Hirshfeld
Assistant Examiner—Dave A. Ghatt
(74) Attorney, Agent, or Firm—Sughrue Mion, PLLC

(57) ABSTRACT

In a printing plate automatic exposing device, a vacuum pump and a pressure sensor are provided in communication with a detection hole provided in a surface plate. When a photopolymer plate is set on the surface plate, a degree of vacuum of the detection hole becomes a predetermined degree of vacuum due to operation of the vacuum pump.

23 Claims, 7 Drawing Sheets

PRINTING PLATE AUTOMATIC EXPOSING DEVICE

BACKGROUND OF THE INVENTION

1. Field of the Invention

The present invention relates to a printing plate automatic exposing device which places a printing plate at a predetermined position on a surface plate and exposes an image onto the printing plate.

2. Description of the Related Art

A technique (printing plate automatic exposing device) has been developed which, by using a printing plate (hereinafter, "photopolymer plate") in which a photosensitive layer (e.g., a photopolymerizable layer) is provided on a support, an image is recorded directly by a laser beam onto the photopolymerizable layer of the photopolymer plate.

In this technique, in order to rapidly carry out image recording onto photopolymer plates, the photopolymer plates must be fed one after the other. A plurality of photopolymer plates are made to wait in a stacked state at a predetermined position, and are automatically removed one at a time, positioned on a surface plate, and fed into an exposure section.

Conventional devices are not provided with a means for detecting whether or not a photopolymer plate is placed on the surface plate. As a result, there is the possibility that proper processings, based on the results of detection as to whether there is or is not a photopolymer plate placed on the surface plate, will not be carried out. For example, there is the possibility that the process will proceed to the next step after the exposure step regardless of the fact that a photopolymer plate is not correctly placed on the surface plate. Further, for example, there is the possibility that, at times when the printing plate automatic exposing device is initially used or times when use of the printing plate automatic exposing device is started up again after the supply of electricity thereto has been stopped, a new printing plate will be conveyed regardless of the fact that a printing plate is placed on the surface plate, and thus two printing plates will be placed on the surface plate, leading to image defects.

SUMMARY OF THE INVENTION

In view of the aforementioned, an object of the present invention is to provide a printing plate automatic exposing device which detects whether or not a printing plate is placed on a surface plate, and which carries out appropriate processing on the basis of the results of detection.

A first aspect of the present invention is a printing plate automatic exposing device in which a printing plate supplied to a predetermined position on a surface plate is vacuum suction adhered onto the surface plate by air being sucked from a suction hole and a suction groove provided in the surface plate, and in this state, an image is exposed onto the printing plate, said printing plate automatic exposing device comprising: a detection portion provided independently from the suction hole and the suction groove at a position on the surface plate which is blocked by printing plates of all dimensions which are set on the surface plate; a suction device communicating with the detection portion and sucking in air from the detection hole; and a pressure sensor communicating with the detection portion, and able to detect that a degree of vacuum of the detection portion is a predetermined degree of vacuum which is set in correspondence with a case in which a printing plate is set on the surface plate.

The predetermined degree of vacuum is set on the basis of the capability of the suction device and on the air permeability (amount of leakage of air) between the suction hole and the printing plate.

Further, the pressure sensor of the printing plate automatic exposing device of the first aspect may be a pressure sensor which outputs a signal which is linear with respect to the degree of vacuum. Or, the pressure sensor may be a pressure switch which outputs a constant signal (a signal turning a contact on and off) when the degree of vacuum is greater than or equal to a set degree of vacuum.

In the printing plate automatic exposing device of the first aspect, the printing plate is supplied to a predetermined position on the surface plate. By sucking air from the suction hole provided in the surface plate, the printing plate can be vacuum suction adhered to the surface plate, and an image can be exposed onto the printing plate in this state.

Further, in the printing plate automatic exposing device, the detection hole is provided in the surface plate independently of the suction hole and the suction groove for vacuum suction adhesion. The detection hole communicates with the suction device and the pressure sensor. When the printing plate is supplied onto the surface plate, in order to detect whether the printing plate is placed on the surface plate, the suction device sucks air from the detection hole, and the pressure sensor detects the degree of vacuum of the detection hole.

Here, when a printing plate is set on the surface plate, i.e., when the detection hole is blocked by the printing plate, the degree of vacuum of the detection hole is the predetermined degree of vacuum. At this time, the pressure sensor detects that the degree of vacuum of the detection hole is the predetermined degree of vacuum, and outputs a predetermined signal.

On the other hand, when no printing plate is set on the surface plate, i.e., when the detection hole is not blocked by the printing plate, the degree of vacuum of the detection hole is not higher than the predetermined degree of vacuum. As a result, the pressure sensor does not detect that the degree of vacuum of the detection hole is the predetermined degree of vacuum, and does not output the predetermined signal.

In this way, in the printing plate automatic exposing device of the first aspect, on the basis of the output signal of the pressure sensor, it can be detected whether or not a printing plate is placed on the surface plate. In this way, a printing plate automatic exposing device which carries out appropriate processing on the basis of the detection signal of the pressure sensor can be obtained.

Moreover, because an inexpensive pressure sensor is used, the printing plate automatic exposing device can be provided at a low cost.

A second aspect of the present invention is a device for automatic exposure of printing plates in accordance with image data, the device comprising: (a) a surface plate mountable in the automatic exposure device for receiving printing plates thereon, the surface plate having a suction hole, a suction groove and a detection hole; (b) a suction system in fluid communication with the suction hole and groove and the detection hole, and operable for applying reduced pressure thereto for suction adherence of printing plates and for use in printing plate detection; (c) a pressure sensor in fluid communication with the detection hole, and providing an output signal when the degree of vacuum in the detection hole at least equals a level corresponding to when a printing plate is received on the surface plate obstructing the detection hole with reduced pressure applied to the detection hole by the suction system; (d) a scanner operable for exposing a printing plate in accordance with image data; and (e) a controller connected in electronic communication to the scanner and the pressure sensor and receiving the output signal and controlling the scanner, the controller controlling processing based at least in part, in accordance with the signal received.

A third aspect of the present invention is a method for detecting printing plate presence on a support surface in an exposure device, the method comprising the steps of: (a) providing a hole on the support surface; (b) applying a reduced pressure to the hole; (c) sensing the pressure in the hole using a pressure sensor; and (d) determining that a printing plate is present on the support surface if the degree of vacuum sensed is at least equal to a predetermined level, and otherwise determining that a printing plate is not present on the support surface.

BRIEF DESCRIPTION OF THE DRAWINGS

FIG. 6B is a schematic structural view illustrating a side surface of the surface plate, and a detection hole, a vacuum pump, a pressure sensor, and the like.

DESCRIPTION OF THE PREFERRED EMBODIMENTS

Overall Structure

Figure 1:
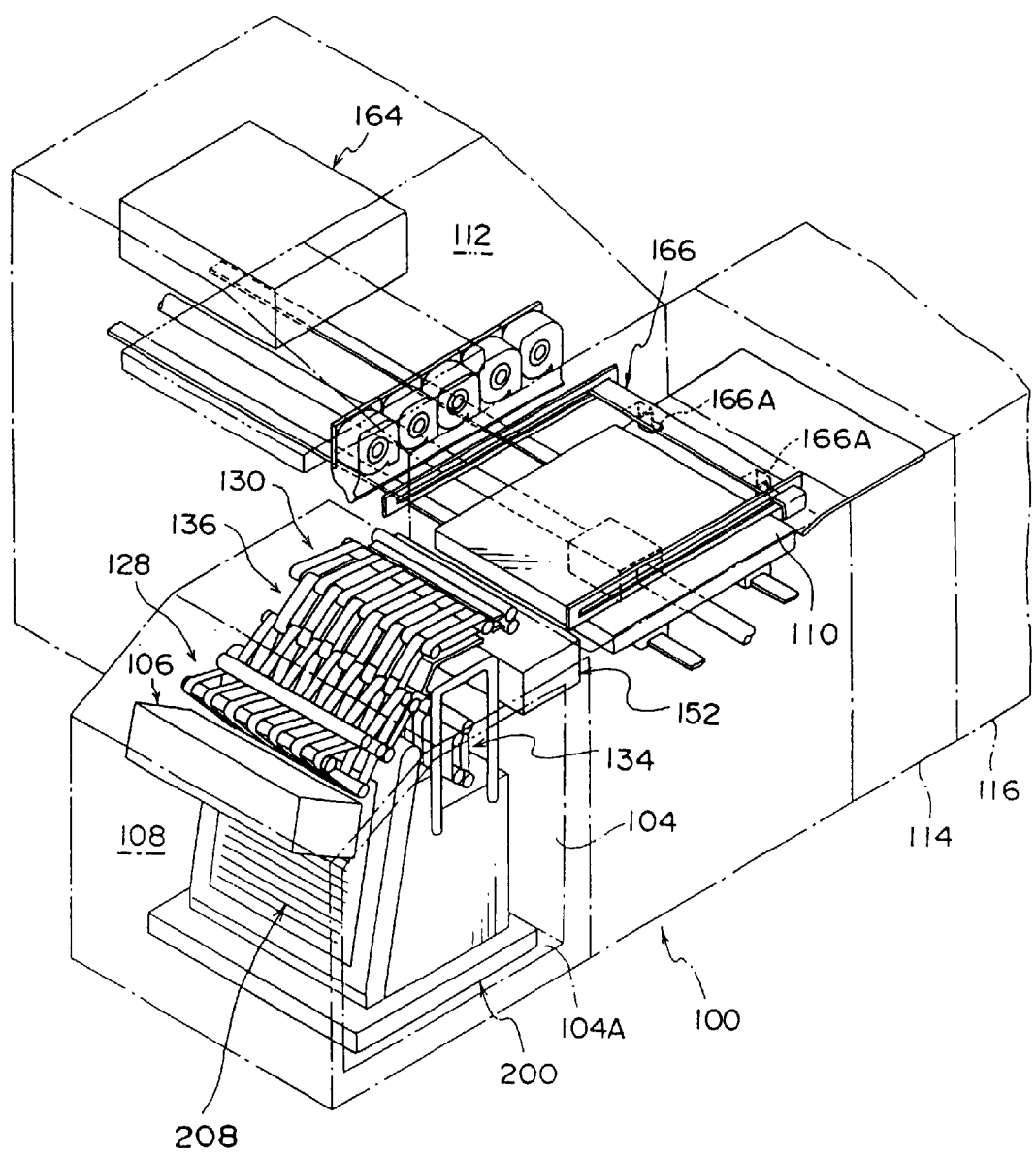
FIG. 1 is a perspective view illustrating the overall structure of a printing plate automatic exposing device relating to an embodiment of the present invention.

FIG. 1 illustrates a printing plate automatic exposing device 100 for photopolymer plates relating to an embodiment of the present invention. (The photopolymer plate is a printing plate in which a photosensitive layer (e.g., a photopolymerizable layer) is provided on a hard support made of aluminum.)

The printing plate automatic exposing device 100 is formed by a plate supplying section 108, a surface plate 110, and an exposing section 112. The plate supplying section 108 includes a plate accommodating section 104 which accommodates photopolymer plates 102 (see FIG. 2) loaded at a carriage 200, and a sheet section 106 which takes out the photopolymer plate 102 accommodated in the plate accommodating section 104. The photopolymer plate 102 is positioned and held at the surface plate 110. The exposing section 112 records an image onto the photopolymer plate 102 positioned on the surface plate 110.

A printing plate automatic developing device 116 can be set, via a buffer section 114, at the downstream side of the printing plate automatic exposing device 100. In this way, all of the processes of plate supplying, exposure, and developing can be carried out automatically.

Figure 2:
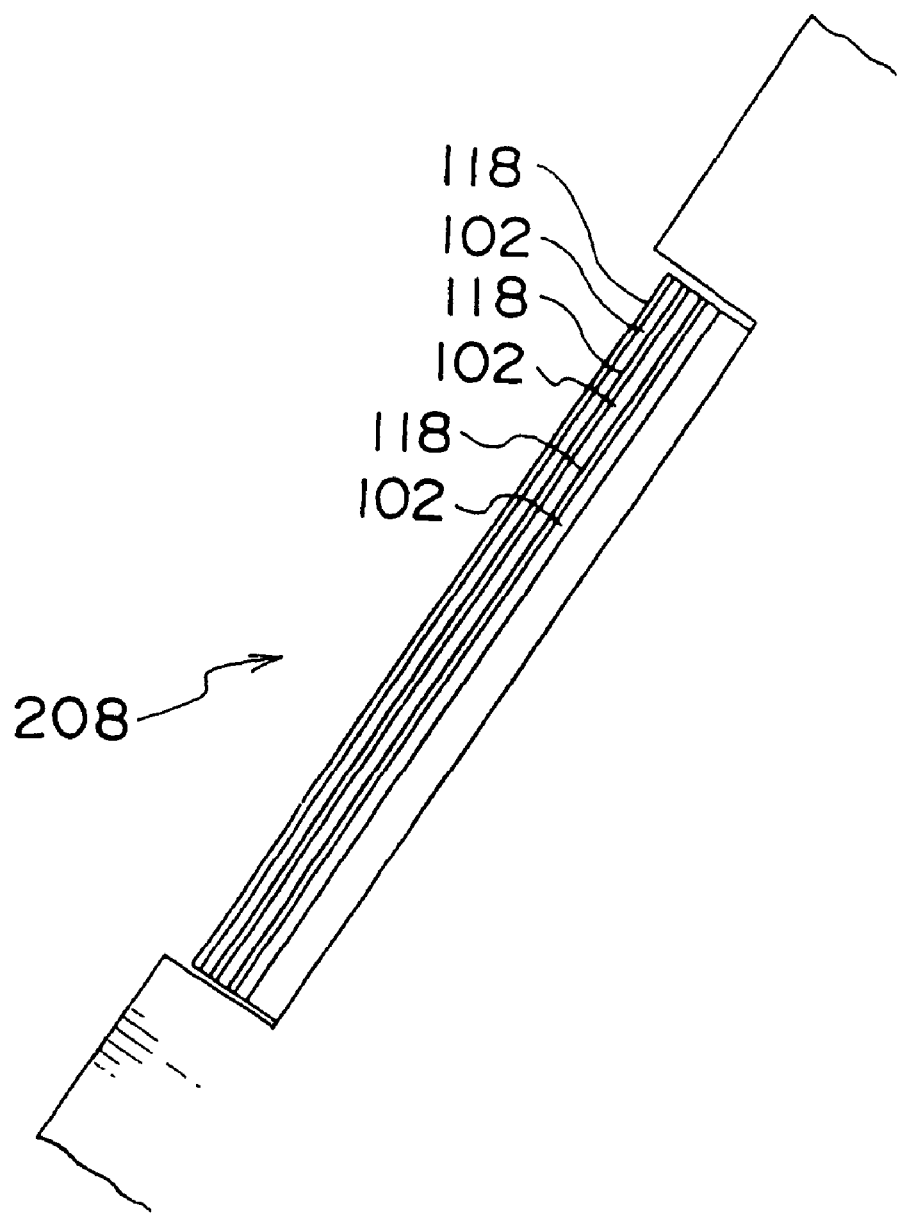
FIG. 2 is a side view illustrating a state of interleaf sheets and photopolymer plates stacked in a magazine.
Figure 3:
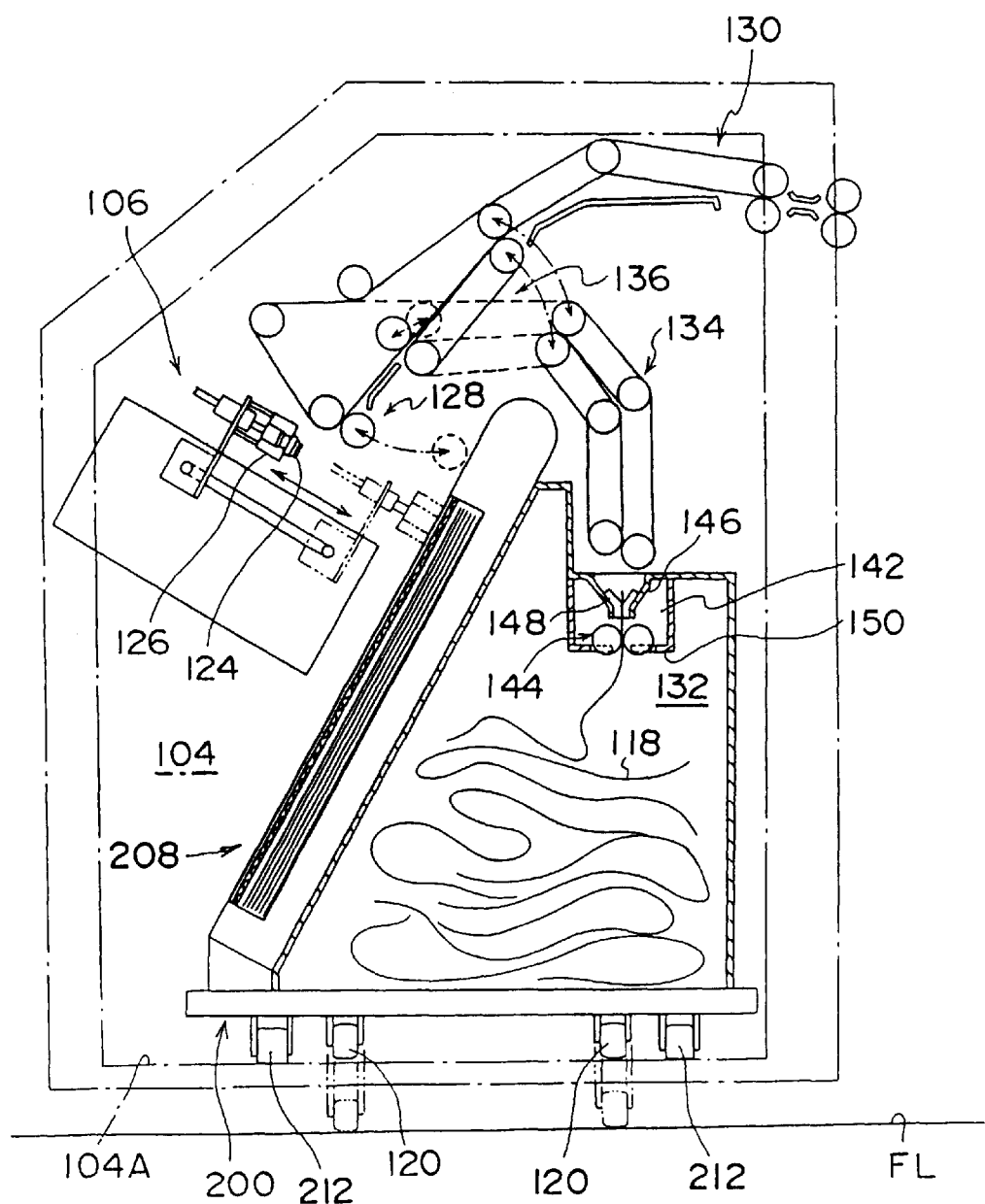
FIG. 3 is a side view of a plate supplying section.

As illustrated in FIG. 3, the carriage 200, which is provided with a magazine 208 which accommodates a plurality of the photopolymer plates 102, can be accommodated in the plate accommodating section 104. As illustrated in FIG. 2, a single interleaf sheet 118 for protection is provided at the surface of each of the photopolymer plates 102 accommodated in the magazine 208. As a result, the photopolymer plates 102 and the interleaf sheet 118 are stacked alternately.

A floor portion 104A is formed is formed at the plate accommodating section 104 at a position which is higher than the floor surface, so that the carriage 200 can be lifted up onto the floor portion 104A from the floor surface. Namely, the carriage 200 is supported at the floor surface via casters 120, and the casters 120 are movable, with respect to the carriage 200, between a projecting position (shown by the imaginary lines in FIG. 3) and an accommodated position (shown by the solid lines in FIG. 3).

In accordance with the operation of accommodating the carriage 200 into the plate accommodating section 104, the casters 120 are moved to their accommodated positions so as to be folded-up upwardly. Simultaneously, auxiliary rollers 212 correspond to the floor portion 104A. Thereafter, the carriage 200 is supported via the auxiliary rollers 212 with respect to the floor portion 104A.

The sheet section 106 is provided above the plate accommodating section 104. The sheet section 106 takes out the alternately stacked photopolymer plates 102 and the interleaf sheet 118, which are accommodated in the magazine 208, and feeds the photopolymer plate 102 or the interleaf sheet 118 to the plate feeding section 108. Thus, the sheet section 106 is provided with a suction cup 124 which sucks the photopolymer plate 102 or the interleaf sheet 118. Further, a suction fan 126 is provided in a vicinity of the suction cup 124 and separately from the suction cup 124. The suction fan 126 serves as an assisting means at the time the interleaf sheet 118 is sucked. The suction cup 124 and the suction fan 126 can be made to approach or made to move away from the topmost layer of the interleaf sheets 118 and the photopolymer plates 102 which are integrally stacked together.

Here, when the photopolymer plate 102 is to be suction adhered, the surface plate 124 is made to contact the photopolymer plate 102 such that the photopolymer plate 102 is suction adhered. When the interleaf sheet 118 is to be sucked, the suction fan 126 is disposed at a position which is slightly apart from the interleaf sheet 118 (or may contact the interleaf sheet 118). By operating only the suction fan 126, only the interleaf sheet 118, which is lightweight and thin, floats (is raised) up, and thereafter, the interleaf sheet 118 is suction adhered by the suction cup 124. In this way, the photopolymer plate 102 positioned beneath the interleaf sheet 118 can be prevented from being sucked up together with the interleaf sheet 118.

The plate supplying section 108 is basically structured by a common conveying section 128, a photopolymer plate conveying section 130, an interleaf sheet conveying section 134, and a switching conveying section 136. The common conveying section 128 receives and conveys the photopolymer plate 102 or the interleaf sheet 118 from the sheet section 106. The photopolymer plate conveying section 130 receives the photopolymer plate 102 and sends the photopolymer plate 102 out to the surface plate 110. The interleaf sheet conveying section 134 receives the interleaf sheet 118 and feeds the interleaf sheet 118 out to an interleaf sheet accommodating box 132 (which is loaded at the carriage 200). The switching conveying section 136 carries out guiding by switching from the common conveying section 128 to either of the photopolymer plate conveying section 130 or the interleaf sheet conveying section 134.

Namely, because the photopolymer plates 102 and the interleaf sheets 118 are alternately stacked, each time sucking is carried out at the plate section 106, the switching conveying section 136 carries out switching, such that the photopolymer plates 102 and the interleaf sheets 118, which are suction adhered alternately, are conveyed in respectively different predetermined directions.

Figure 4A:
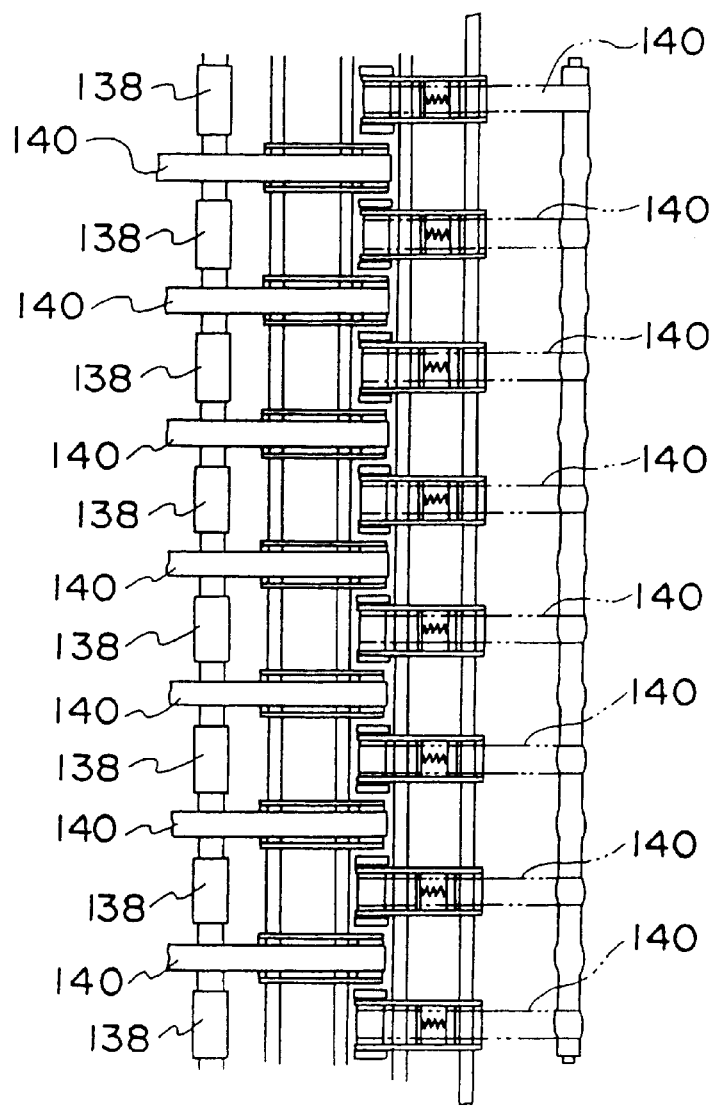
FIGS. 4A, 4B and 4C are plan views illustrating a portion of a conveying system of the plate supplying section.
Figure 4B:
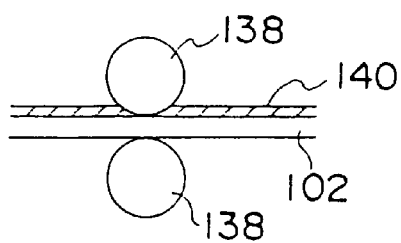

Here, as illustrated in FIG. 4A, the common conveying section 128, the photopolymer conveying section 130, and the switching conveying section 136 are a conveying system in which skewer rollers 138 and narrow belts 140 are combined. The main function is the conveying of the photopolymer plates 102 (see FIG. 4B). Namely, the photopolymer plate 102 is conveyed by the strong nipping force of the skewer rollers 138, and the narrow belts 140 function as guide plates which move synchronously with the conveying.

Figure 4C:
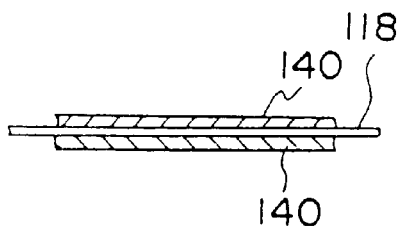

In contrast, as illustrated in FIG. 4C, the interleaf sheet conveying section 134 is a conveying system formed only by narrow belts 140, and conveys the interleaf sheet 118 by weak nipping force of the narrow belts 140.

Figure 5:
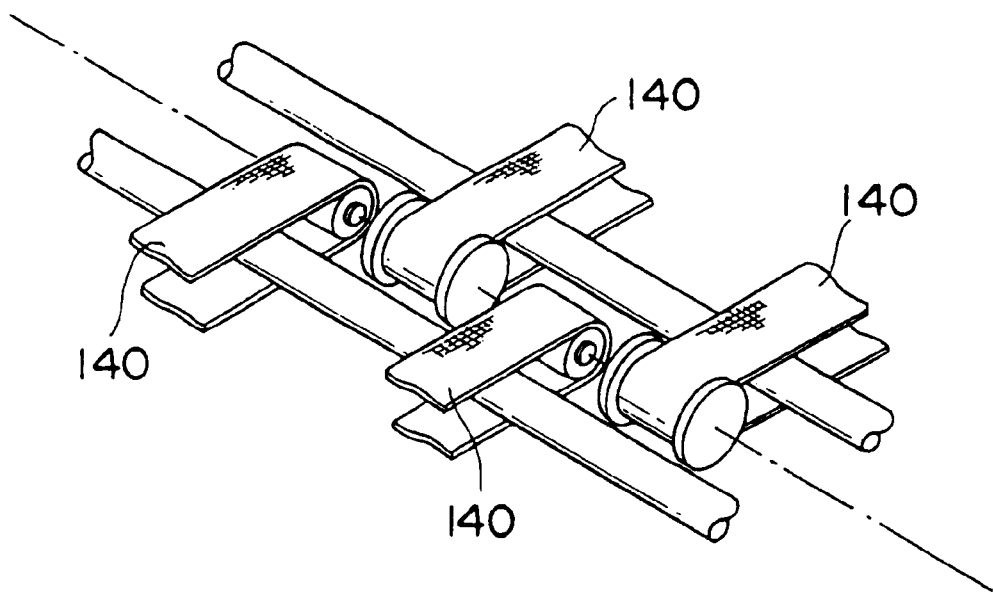
FIG. 5 is a perspective view illustrating a transfer section of a different conveying system of the plate supplying section.

Here, as illustrated in FIG. 5, the distal end portions of the transfer sections at each conveying section project out in skewer forms alternately, and overlap such that the concave or convex distal end of one conveying section opposes the convex or concave distal end of the other conveying section (so as to form a coaxial, common conveying path). In this way, at the time the photopolymer plate 102 and the interleaf sheet 118 are transferred, they can be prevented from getting wound up on the skewer rollers 138 and the narrow belts 140.

As illustrated in FIG. 3, the interleaf sheet 118 conveyed by the interleaf sheet conveying section 134 is guided into the interleaf sheet accommodating box 132 provided at the carriage 200. A pair of rollers 144 are provided at an insertion opening 142 for the interleaf sheet 118, which is provided at the upper portion of the interleaf sheet accommodating box 132. The rollers 144 rotate at a linear speed which is slightly faster (about 1.1 times faster) than the conveying speed of the interleaf sheet conveying section 134. In this way, when the interleaf sheet 118 is transferred over between the interleaf sheet conveying section 134 and the rollers 144, the interleaf sheet 118 is conveyed while being maintained in a state of predetermined tension, such that jamming caused by the interleaf sheet 118 going slack or the like can be prevented.

Taper shaped guide plates 146, whose widths (in the direction of thickness of the interleaf sheet 118) become gradually thinner, are provided in a vicinity of the insertion opening 142. A charge-removing brush 148 is mounted to each of the guide plates 146 which are formed in taper shapes and which oppose one another. The charge-removing brushes 148 remove charges from the interleaf sheet 118 inserted into the insertion opening 142.

The pair of rollers 144 are skewer rollers, and a partitioning plate 150 is provided so as to follow along the convexities and concavities formed by the skewer shapes of the rollers 144. In this way, even if the rollers 144 contact a portion of the interleaf sheet 118 which has been accommodated in the interleaf sheet accommodating section 134, the interleaf sheet 118 is prevented, by the partitioning plate 150, from being wound up.

As illustrated in FIG. 1, the photopolymer plate 102 conveyed by the photopolymer plate conveying section 130 moves away from the photopolymer plate conveying section 130 while being conveyed horizontally, and is transferred onto the surface plate 110.

Figure 6A:
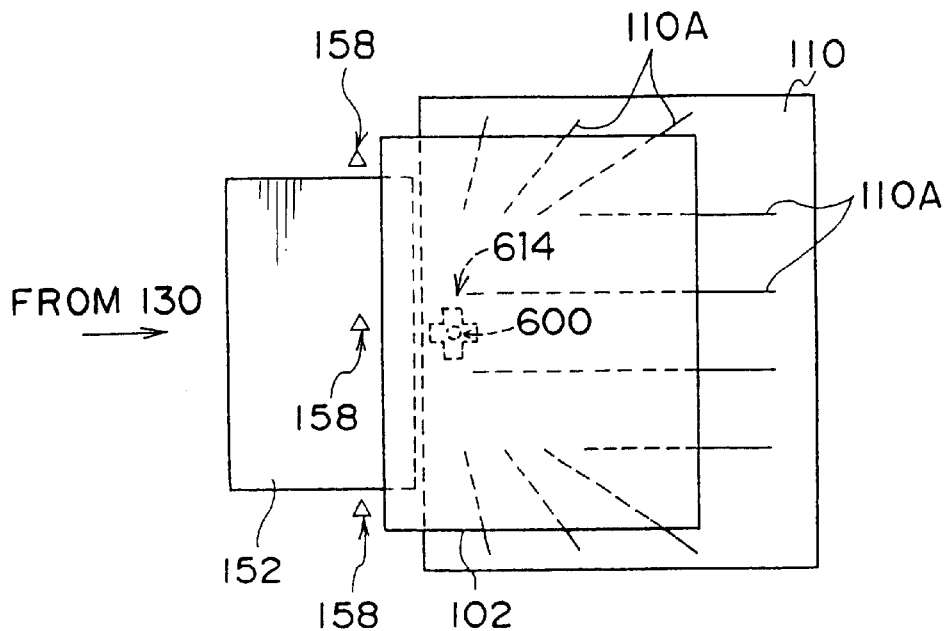
FIG. 6A is a plan view of a surface plate.

Here, the height of the upper surface of the surface plate 110 is at a position which is lower than the horizontal conveying height of the photopolymer plate conveying section 130, and a slight gap is formed between the photopolymer plate conveying section 130 and the surface plate 110 in the conveying direction. As a result, when the photopolymer plate 102 is discharged from the photopolymer plate conveying section 130, the photopolymer plate 102 lands on the surface plate 110 in a state in which it hangs down slightly, and the conveying direction trailing end portion thereof is positioned so as to extend off of the surface plate 110. A temporarily supporting plate 154 is disposed for this extended portion of the photopolymer plate 102. The temporarily supporting plate 154 is provided at a moving body 152 which can approach and move away from the surface plate 110. The temporarily supporting plate 154 prevents the photopolymer plate 102 from hanging down (see FIGS. 6A and 6B).

Figure 6B:
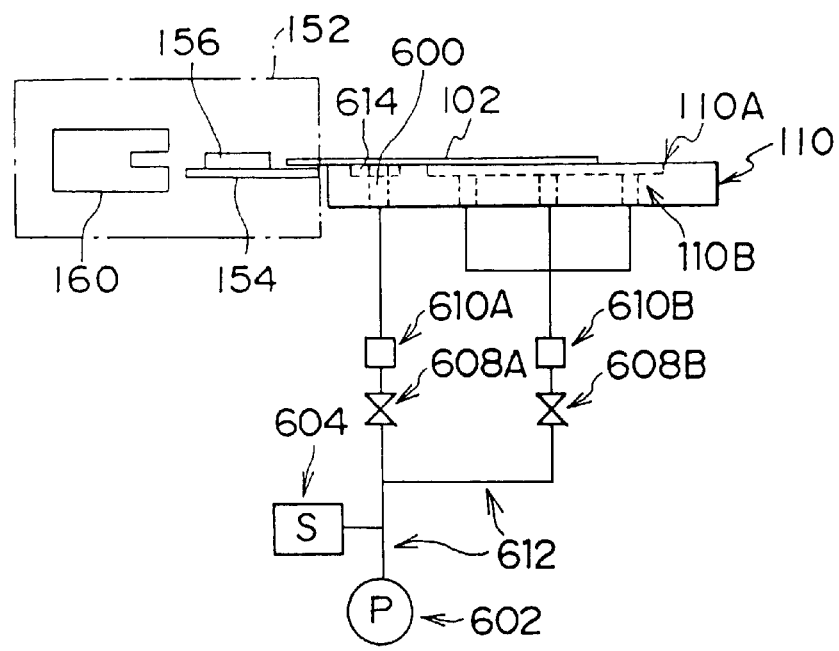

As illustrated in FIG. 6B, a pusher plate 156, for pushing the trailing end portion of the photopolymer plate 102 in the conveying direction, is provided at a portion of the temporarily supporting plate 154. Due to the trailing end portion of the photopolymer plate 102 being pushed by the pusher plate 156, movement of the photopolymer plate 102 in a direction inclined with respect to the proper conveying direction thereof can be eliminated, and the photopolymer plate 102 can be fed out to a predetermined conveying direction reference position. At this reference position, the conveying direction trailing end of the photopolymer plate 102 slightly juts out from the surface plate 110.

At this reference position, sensors 158 are provided at plural positions including the both corner portions of the conveying direction trailing end portion of the photopolymer plate 102. The pushing of the pusher plate 156 is stopped due to the sensors 158 detecting the conveying direction trailing end portion of the photopolymer plate 102. Further, these sensors 158 are also used to detect the transverse direction position of the photopolymer plate 102. Namely, by moving the surface plate 110 in the transverse direction, the corner portions of the photopolymer plate 102 are made to coincide with the sensors 158, and this position is registered as the initial position of the photopolymer plate 102.

The photopolymer plate 102, which has been moved to the initial position, is positioned relative to a scanning exposure start position at the exposure section 112. In this state, the photopolymer plate 102 is sucked and held by suction holes 110B and suction grooves 110A provided at the surface plate 110.

A punch hole is formed in the sucked and held photopolymer plate 102, by a puncher 160 provided at the moving body 152.

As will be described in detail later, a detection hole 600 and a detection groove 614 are provided in the surface plate 110, and communicate with a vacuum pump 602 and a pressure sensor 604. In this way, the pressure sensor 604 detects which of the set degree of vacuum and the degree of vacuum of the detection hole 600 at the time of suction by the vacuum pump 602 is larger. On the basis of the results of detection, a determination is made as to whether or not a photopolymer plate 102 is placed on the surface plate 110.

The surface plate 110 is reciprocally movable (in the same direction as transverse direction movement for positioning)

at a constant speed between a first position (the solid line position in FIG. 1), at which the surface plate 110 receives the photopolymer plate 102 from the photopolymer plate conveying section 130, and a second position (the imaginary line position in FIG. 1), at which the surface plate 110 is accommodated in the exposure section 112.

At the exposure section 112, a scanning unit 164 is provided above the conveying path of the surface plate 110. A laser beam, whose lighting is controlled in accordance with image signals, is main scanned (in a direction orthogonal to the conveying direction of the surface plate 110). The conveying, in one direction, of the surface plate 110 is subscanning movement, and as a result thereof, an image is exposed (recorded) onto the photopolymer plate 102 on the surface plate 110 during conveying of the surface plate 110 in that one direction toward the exposure section 112. By conveying the surface plate 110 in the opposite direction (the return direction), the surface plate 110 is returned to its original position. The sucking and holding of the photopolymer plate 102 on the surface plate 110 which has returned to its original position is then released.

Figure 7A:
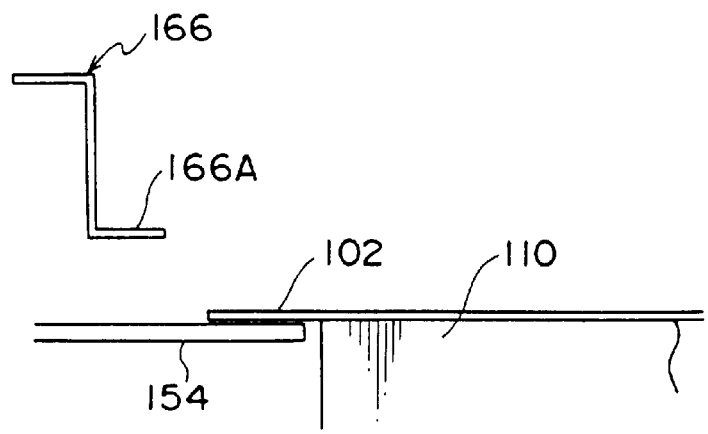
FIG. 7A is a side view illustrating operation of a discharge mechanism portion in a state in which operation initially starts.

The discharge mechanism section 166 stands-by, in correspondence with the surface plate 110 after image-recording, which has returned to its original position, at the conveying direction trailing end portion side of the photopolymer plate 102 by the photopolymer plate conveying section 130. The discharge mechanism section 166 then passes above the surface plate 110 and is moved toward the conveying direction leading end portion of the photopolymer plate 102 (see FIG. 7A).

Figure 7B:
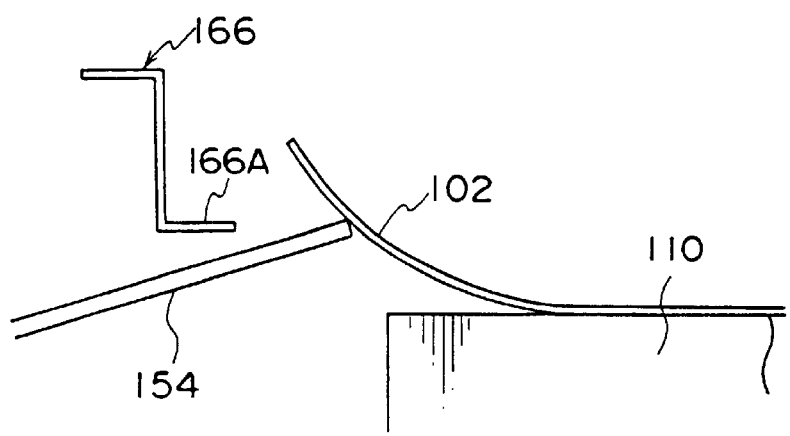
FIG. 7B is a side view illustrating operation of the discharge mechanism portion in a state in which a photopolymer plate is raised up.
Figure 7C:
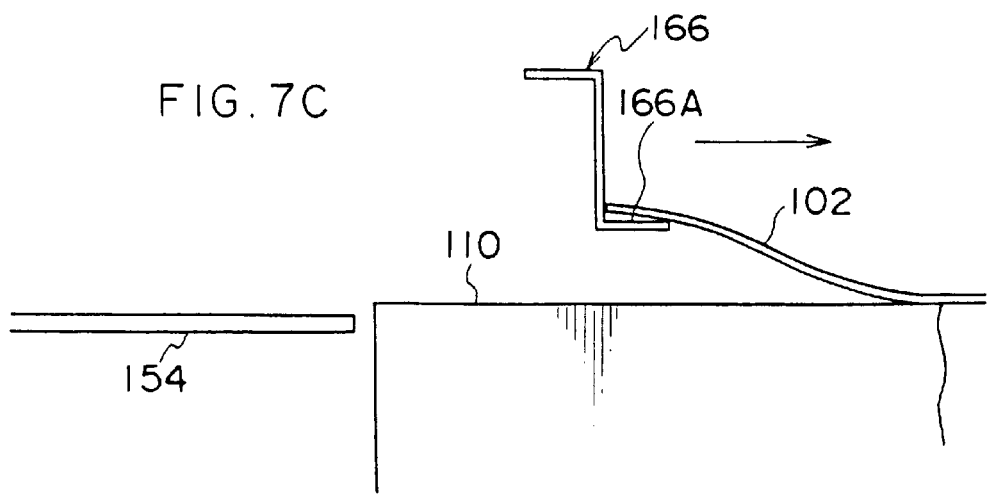
FIG. 7C is a side view illustrating operation of a discharge mechanism portion at a time of discharging the photopolymer plate.

A hook portion 166A, on which the conveying direction trailing end portion of the photopolymer plate 102 is set, is formed at the discharge mechanism section 166. The trailing end portion of the photopolymer plate 102, which is jutting out from of the surface plate 110, is lifted up by the temporarily supporting plate 154 provided at the moving body 152 (see FIG. 7B), and the discharge mechanism section 166 is moved in the conveying direction of the photopolymer plate 102. In this way, the photopolymer plate 102 catches on the hook portion 166A, and as the discharge mechanism section 166 moves, the photopolymer plate 102 is conveyed to the downstream side of the surface plate 110 (see FIG. 7C). The buffer section 114 and the printing plate automatic developing device 116 are provided at this downstream side. The photopolymer plate 102 is smoothly fed out while the difference between the discharging speed by the discharge mechanism section 116 and the conveying speed in the printing plate automatic developing device 116 is absorbed by the buffer section 114.

Detailed Structure of Surface Plate 110 and Other Members

As shown in FIG. 6, the suction grooves 110A and the suction holes 110B for vacuum sucking the photopolymer plate 102 placed at the predetermined position on the surface plate 110, are formed in the surface plate 110.

A detecting hole 600 is provided in the surface plate 110 at the printing plate conveying direction trailing end portion and at a transverse direction central portion, independently of and so as to not communicate with the suction holes 110B and the suction grooves 110A. A cross-shaped detecting groove 614 is provided so as to be centered about the detecting hole 600 and so as to communicate with the detecting hole 600, independently of and so as to not communicate with the suction holes 110B and the suction grooves 110A. The positions at which the detecting hole 600 and the detecting groove 14 are provided are positions which are blocked by the photopolymer plate 102, regardless of the dimensions of the photopolymer plate 102, when the photopolymer plate 102 is set on the surface plate 110. Accordingly, the presence or absence of photopolymer plates 102 of all dimensions which are processed at the printing plate automatic exposing device 100 can be detected.

The detecting hole 600 and the detecting groove 614 communicate with the vacuum pump 602 and the pressure sensor 604 via a communication path 612.

A portion of the communication path 612 branches off, and the branched-off portions of the communication path 612 communicate with the suction holes 110B and the suction grooves 110A. At the surface plate 110 side of the branched-off portions of the communication path 612, an electromagnetic valve 608A and an electromagnetic valve 608B for blocking-off communication of the respective branches are provided, such that air can be sucked from the detection hole 600 and/or the suction holes 110B. Further, a filter 610A and a filter 610B, for preventing the vacuum pump 602 from sucking up dust, debris or the like at the time of suction, are provided at the surface plate 110 sides of the electromagnetic valve 608A and the electromagnetic valve 608B.

Here, the pressure sensor 604 is disposed further toward the vacuum pump 602 side than the electromagnetic valve 608B is. When the presence or absence of the photopolymer plate 102 is to be detected, due to the electromagnetic valve 610B being closed and the vacuum pump 602 being operated, the presence or absence can be detected without being affected by the dimension of the photopolymer plate 102 being small or by the photopolymer plate 102 being placed such that it is conveyed at an incline. (Namely, by sucking in air from a portion at which the suction grooves 110A are not closed by the photopolymer plate 102, the degree of vacuum does not rise to a predetermined value.)

A degree of vacuum, which is a reference, is set at the pressure sensor 604. When the degree of vacuum of the detecting hole 600 is the set degree of vacuum, the pressure sensor 604 outputs a fixed signal (hereinafter, Y signal). If the degree of vacuum of the detecting hole 600 is less than the set degree of vacuum, the pressure sensor 604 outputs a different signal (hereinafter, N signal). Here, the Y signal and the N signal may be on/off signals, or may be signals which are linear with respect to the degree of vacuum.

The degree of vacuum which is the reference is set in advance on the basis of capabilities of the vacuum pump 602 and the air permeability (the leakage amount of air) between the suction grooves 614 and the photopolymer plate 102. The set degree of vacuum can be made to be sufficiently larger than the loss of pressure due to the filter 610A. Thus, when no photopolymer plate 102 is set on the surface plate 110, even if the degree of vacuum varies due to the pressure loss due to the filter 610A, there is no effect, and it can be stably detected whether or not the photopolymer plate 102 is disposed on the surface plate 110.

Next, operation of the present embodiment will be described.

In the printing plate automatic exposing device 100 having the structure described above, the magazine 208, in which the photopolymer plates 102 and the interleaf sheets 118 are accommodated in a state in which they are stacked alternately, is loaded at the carriage 200, and is accommodated in the plate accommodating section 104 together with the carriage 200. The photopolymer plate is transferred to the common conveying section 128 from the magazine 208 by the plate supplying section 108, and is conveyed to the photopolymer plate conveying section 130 via the switching conveying section 136. On the other hand, the interleaf sheet is transferred to the common conveying section 128 from the magazine by the plate supplying section 108, and is guided to the interleaf sheet accommodating box 132 via the switching conveying section 136 and the interleaf sheet conveying section 134.

When the photopolymer plate 102 is conveyed to the photopolymer plate conveying section 130, the photopolymer plate 102 is fed onto the surface plate 110 by the photopolymer plate conveying section 130. Here, the height of the upper surface of the surface plate 110 is a position which is lower than the horizontal conveying height of photopolymer plate conveying section 130, and there is a slight gap between the photopolymer plate conveying section 130 and the surface plate 110 along the conveying direction. Thus, when the photopolymer plate 102 is fed in from the photopolymer plate conveying section 130, it lands on the surface plate 110 in a state in which it is hanging down slightly. At this time, the electromagnetic valve 608B is closed such that air is sucked from the detection hole 600 by the vacuum pump 602.

When the photopolymer plate 102 lands on the surface plate 110, the photopolymer plate 102 blocks the detection groove 614. The degree of vacuum of the detection hole 600 thereby becomes the set degree of vacuum. The pressure sensor 604 detects this state, and outputs the signal Y. Accordingly, it is detected that the photopolymer plate 102 is on the surface plate 110.

When it is detected that the photopolymer plate 102 is on the surface plate 110, the photopolymer plate 102 is pushed by the pusher plate 156 and is set at the initial position on the surface plate 110, and the electromagnetic valve 608B is opened. In this way, the vacuum pump 602 is activated, and air is sucked in from the suction holes 110B of the surface plate 110 via the communication path 612. The interiors of the suction grooves 110A which communicate the suction holes 110B and the suction holes 110B become a vacuum state, and the photopolymer pate 102 placed on the surface plate 110 is vacuum suction adhered onto the surface plate 110 by the suction holes 110B and the suction grooves 110A. In this way, the photopolymer plate 102 is fit tightly onto the surface plate 110 at the initial position.

In the state in which the photopolymer plate 102 is tightly fit on the surface plate 110, the surface plate 110 is moved toward the exposure section 112, and an image is exposed (recorded) by the exposure section 112 onto the photopolymer plate 102 which is tightly fit on the surface plate 110. After the surface plate 110 has returned from the exposure section 112 to its original position, the vacuum suctioning of the photopolymer plate 102 is released, and the photopolymer plate 102 is conveyed to the printing plate automatic developing device 116 by the discharge mechanism section 166.

When the photopolymer plate 102 which has been fed onto the surface plate 110 by the photopolymer plate conveying section 130 and which has landed on the surface plate 110 is not blocking the detection groove 614, i.e., when the photopolymer plate 102 is not fed correctly onto the surface plate 110 from the photopolymer plate conveying section 130, even if air is sucked in from the detection hole 600 by the vacuum pump 602, the degree of vacuum of the detection hole 600 is not the set degree of vacuum. The fact that the degree of vacuum of the detection hole 600 is less than the set degree of vacuum is detected by the pressure sensor 604, and the N signal is outputted from the pressure sensor 604. In this way, when it is detected that the photopolymer plate 102 is not placed on the surface plate 110, the printing plate automatic exposing device 100 proceeds to an error sequence (abnormality processing step).

Further, at times when the printing plate automatic exposing device 100 is initially used or times when use of the printing plate automatic exposing device 100 is started up again after the supply of electricity thereto has been stopped, before entering into the normal operating state, it is detected whether a photopolymer plate 102 is placed on the surface plate 110. Namely, the electromagnetic valve 608B is closed and air is sucked in from the detection hole 600 by the vacuum pump 602. When the degree of vacuum of the detection hole 600 is the set degree of vacuum, this value is detected by the pressure sensor 604, and the Y signal is outputted from the pressure sensor. In this way, when it is detected that a photopolymer plate 102 is placed on the surface plate 110, the printing plate automatic exposing device 100 proceeds to a photopolymer plate 102 discharging step. On the other hand, when the degree of vacuum of the detection hole 600 is not the set degree of vacuum, a value which is less than the set degree of vacuum is detected by the pressure sensor 604, and the N signal is outputted from the pressure sensor 604. In this way, when it is detected that there is no photopolymer plate 102 on the surface plate 110, the printing plate automatic exposing device 100 returns to normal operation.

In this way, at the printing plate automatic exposing device 100 relating to the present embodiment, on the basis of the detection signal of the pressure sensor 604, it is detected whether a photopolymer plate 102 is placed on the surface plate 110, and appropriate processings corresponding to the respective stages are carried out on the basis of the results of detection.

In the present embodiment, the vacuum pump 602 is used both for the vacuum pump, which is operated when it is detected whether a photopolymer plate 102 is placed on the surface plate 110, and the vacuum pump, which is operated when the photopolymer plate 102 is vacuum suction adhered onto the surface plate 110. However, respectively independent vacuum pumps may be provided.

Further, the electromagnetic valve 608A may be omitted, and the detection hole 600 and the detection groove 614 may be used for the vacuum suction of the photopolymer plate 102 onto the surface plate 110.

What is claimed is:

1. A printing plate automatic exposing device in which a printing plate supplied to a predetermined position on a surface plate is vacuum suction adhered onto the surface plate by air being sucked from a suction hole and a suction groove provided in the surface plate, and in this state, an image is exposed onto the printing plate, said printing plate automatic exposing device comprising:

a detection portion, provided independently from the suction hole and the suction groove, at a position on the surface plate which is blocked by printing plates of all dimensions which are set on the surface plate;

a suction device communicating with the detection portion and sucking in air from the detection portion; and a pressure sensor communicating with the detection portion, and able to detect that a degree of vacuum of the detection portion is a predetermined degree of vacuum which is set in correspondence with a case in which a printing plate is set on the surface plate.

2. A printing plate automatic exposing device according to claim 1, further comprising:

a first valve provided between the suction device and the detection portion; and a second valve provided between the suction device and the suction hole.

3. A printing plate automatic exposing device according to claim 2, wherein a filter for preventing suction of debris at a time of suction by the suction device is provided at each of the first valve and the second valve.

4. A printing plate automatic exposing device according to claim 1, wherein the pressure sensor outputs a first signal in a case in which the degree of vacuum of the detection portion is less than the predetermined degree of vacuum, and a second signal in a case in which the degree of vacuum of the detection portion is equal to the predetermined degree of vacuum.

5. A printing plate automatic exposing device according to claim 4, wherein the printing plate automatic exposing device carries out processing corresponding to the first signal outputted from the pressure sensor, and processing corresponding to the second signal outputted from the pressure sensor.

6. A printing plate automatic exposing device according to claim 1, wherein the suction device has a first pump operated for suction by the suction hole, and a second pump operated for suction by the detection portion.

7. A printing plate automatic exposing device according to claim 1, wherein the suction device is a pump which is capable of operation for suction by the suction hole and operation for suction by the detection portion.

8. A device for automatic exposure of printing plates in accordance with image data, the device comprising:
(a) a surface plate mountable in the automatic exposure device for receiving printing plates thereon, the surface plate having a suction hole, a suction groove and a detection hole;
(b) a suction system in fluid communication with the suction hole and groove and the detection hole, and operable for applying reduced pressure thereto for suction adherence of printing plates and for use in printing plate detection;
(c) a pressure sensor in fluid communication-with the detection hole, and providing an output signal when the degree of vacuum in the detection hole at least equals a level corresponding to when a printing plate is received on the surface plate obstructing the detection hole with reduced pressure applied to the detection hole by the suction system;
(d) a scanner operable for exposing a printing plate in accordance with image data; and
(e) a controller connected in electronic communication to the scanner and the pressure sensor and receiving the output signal and controlling the scanner, the controller controlling processing based at least in part, in accordance with the signal received.

9. The device of claim 8, wherein a cross-shaped groove is provided in fluid communication with the detection hole.

10. The device of claim 8, further comprising:
(a) a first valve provided between the suction system and the detection hole; and
(b) a second valve provided between the suction system and the suction hole.

11. The device of claim 10, further comprising a filter provided at each of the first valve and the second valve for capturing debris.

12. The device of claim 8, wherein the suction system includes a first pump in communication with the suction hole operable for applying a reduced pressure to the suction hole, and a second pump in communication with the detection hole operable for applying a reduced pressure to the detection hole.

13. The device of claim 8, wherein the suction system includes a pump operable for providing reduced pressure to both the suction hole and the detection hole at the same time.

14. The device of claim 8, wherein the pressure sensor outputs a first signal when the degree of vacuum is less than the level, and a second signal when the degree of vacuum at least equals the level.

15. The device of claim 14, wherein the signals are communicated to the controller, and the controller controls processing based at least in part, on the signals received from the pressure sensor.

16. The device of claim 8, wherein the suction system includes a subsystem in fluid communication with the detection hole, and wherein fluid communication in the subsystem with the detection hole is independent of fluid communication of the suction hole and groove.

17. A method for detecting printing plate presence on a support surface in an exposure device, the method comprising the steps of:
(a) providing a suction hole and a suction groove and detection hole on the support surface;
(b) applying a reduced pressure to the detection hole;
(c) sensing the pressure in the detection hole using a pressure sensor; and
(d) determining that a printing plate is present on the support surface if the degree of vacuum sensed under a condition of the reduced pressure is at least equal to a predetermined level, and otherwise determining that a printing plate is not present on the support surface.

18. The method of claim 17, wherein the step of applying a reduced pressure is performed using a pump.

19. The method of claim 18, further comprising the step of setting the predetermined level in accordance with the pump capacity.

20. The method of claim 19, wherein the step of setting the predetermined level in accordance with the pump capacity, further includes setting the predetermined level in accordance with air permeability between printing plates and the support surface.

21. The method of claim 17, further comprising the step of setting determined level in accordance with air permeability between plates and the support surface.

22. A printing plate automatic exposing device in which a printing plate supplied to a predetermined position on a surface plate is vacuum suction adhered onto the surface plate by air being sucked from a suction hole and a suction groove provided in the surface plate, and in this state, an image is exposed onto the printing plate, said printing plate automatic exposing device comprising:
a detection portion, provided independently from the suction hole and the suction groove, at a position on the surface plate which is blocked by printing plates of a plurality of dimensions which are set on the surface plate;
a suction device communicating with the detection portion and sucking in air from the detection portion; and
a pressure sensor communicating with the detection portion, and able to detect that a degree of vacuum of the detection portion is a predetermined degree of vacuum which is set in correspondence with a case in which a printing plate is set on the surface plate.

23. A method for detecting printing plate presence on a support surface in an exposure device, the method comprising the steps of:

(a) providing a suction hole and a suction groove on the support surface;
(b) providing a detection portion independently from the suction hole and the suction groove at a position on the support surface;
(c) sensing the pressure in the detection portion using a pressure sensor; and determining that a printing plate is present on the support surface if the degree of vacuum sensed is at least equal to a predetermined level, and otherwise determining that a printing plate is not present on the support surface.

* * * * *